(12) United States Patent
Nojima

(10) Patent No.: US 6,222,765 B1
(45) Date of Patent: Apr. 24, 2001

(54) NON-VOLATILE FLIP-FLOP CIRCUIT

(75) Inventor: Isao Nojima, Los Altos, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/507,570

(22) Filed: Feb. 18, 2000

(51) Int. Cl.[7] .................................................. G11C 7/00
(52) U.S. Cl. ................... 365/185.08; 365/185.01; 365/185.1; 365/185.07
(58) Field of Search .................. 365/185.01, 185.07, 365/185.08, 185.1

(56) References Cited

U.S. PATENT DOCUMENTS

| | | |
|---|---|---|
| 5,029,130 | 7/1991 | Yeh . |
| 5,572,054 | 11/1996 | Wang et al. . |
| 5,625,211 * | 4/1997 | Kowshik ............................ 257/317 |
| 5,644,529 * | 7/1997 | Pascucci et al. ................ 365/185.05 |
| 5,696,455 * | 12/1997 | Madurawe ............................ 326/41 |
| 5,781,471 * | 7/1998 | Kowshik et al. ............... 365/185.07 |
| 5,812,458 * | 9/1998 | Gotou .............................. 365/185.23 |
| 5,818,753 * | 10/1998 | Gotou .............................. 365/185.03 |
| 5,978,262 * | 11/1999 | Marqust et al. ................. 365/185.01 |
| 6,067,253 * | 5/2000 | Gotou .............................. 365/185.08 |
| 6,081,575 * | 6/2000 | Chevallier .............................. 377/20 |
| 6,141,247 * | 10/2000 | Roohparvar et al. ........... 365/185.08 |

OTHER PUBLICATIONS

See FIG. 1 of the drawings, further described in the specification of this application.

\* cited by examiner

*Primary Examiner*—Viet Q. Nguyen
(74) *Attorney, Agent, or Firm*—Gray Cary Ware & Freidenrich LLP

(57) ABSTRACT

A combination non-volatile latch circuit has a volatile latch circuit having a bit signal and an inverse bit signal. A first and a second non-volatile cell of the split gate floating gate type having a first terminal, a second terminal and a control gate is supplied. A first switch supplies the bit signal to the first terminal of the first cell and the inverse bit signal to the first terminal of the second cell. A second switch supplies the bit signal to the first terminal of the second cell and the inverse bit signal to the first terminal of the first cell. A first voltage can be supplied to the second terminal of the first and second cells and a second voltage supplies a voltage to the control gate of the first and second cells. In this manner, the latch can be operated independently of the non-volatile memory cells, the status of the latch can be restored by the status of the non-volatile memory cells, and the contents of the latch can be stored in the non-volatile memory cells.

7 Claims, 2 Drawing Sheets

NON-VOLATILE FLIP-FLOP CIRCUIT

TECHNICAL FIELD

The present invention relates to non-volatile memory cells connected in tandem to a volatile flip-flop, and more particularly to such a combination circuit whereby data contents of the volatile flip-flop can be stored in the non-volatile memory cells and vise versa.

BACKGROUND OF THE INVENTION

Volatile memories, such as static RAM latches are well known in the art. They are characterized by their ability to store and read out very quickly the data content stored therein. However, a drawback of volatile memory cell, such as a SRAM, is that the data content is lost once power is turned off.

Non-volatile memory cells, such as those using a floating gate to store electrical charges thereon, is also well known in the art. Their advantage is that the data content is stored even if power is turned off. However, the storing of even a single bit of information in a non-volatile memory cell is much slower than the storing of the bit information in a volatile memory cell.

Heretofore, the use of a combination of an SRAM with non-volatile memory cells is also well known in the art. Referring to FIG. 1, there is shown one embodiment of a combination circuit 10. The circuit 10 comprises a conventional SRAM 20. The SRAM 20 is characterized by a pair of cross-coupled PMOS transistors 22 and 24, and a pair of cross-coupled NMOS transistors 26 and 28. At a first node 30, the input/output signal to and from the SRAM 20 can be provided. At the second node 32, the inverse of the signal provided at the first node 30 can be provided to or from the SRAM 20. Thus, as shown in FIG. 1, conventionally, the signal line BL is shown as being supplied to the first node 30 and its inverse $\overline{BL}$ is supplied to the second node 32. Each of the signals BL and $\overline{BL}$ are supplied through respective switching transistors 34 and 36 whose gates are connected to the signal EERCL and which when activated serves to pass through the signal BL or $\overline{BL}$ to or from the SRAM 20.

The non-volatile memory cell section of the circuit 10 comprises a pair of split gate floating gate memory cells 40 and 42 of the type that is described in U.S. Pat. Nos. 5,029,130 and 5,572,054, whose disclosures are incorporated herein in their entirety by reference. As disclosed in these patents, each of the memory cells 40 and 42 comprises a first terminal and second terminal with a channel therebetween. A floating gate (shown as 44 and 46, respectively for the cells 40 and 42) is formed over a portion of the channel and is insulated therefrom and is over a portion of the first terminal. The first terminals of memory cells 40 and 42 are connected to MOS transistors 48 and 50 respectively, which are in turn connected to the switching transistors 34 and 36. The gates of the transistors 48 and 50 are connected to the floating gates 44 and 46 respectively. Finally, the memory cells 40 and 42 further comprises control gates 52 and 54 respectively which overlap a portion of the channel. The control gates are connected together and receive the signal RCL. The second terminal of the memory cells 40 and 42 receive the signals BL and $\overline{BL}$ respectively.

In the operation of the circuit 10, the memory cells 40 and 42 are initially erased. As disclosed in U.S. Pat. Nos. 5,029,130 and 5,572,054, this means electrons are removed from the floating gates 44 and 46 respectively by tunneling electrons through an insulating layer to the control gates 52 and 54 respectively. This can be done, for example, by connecting the signal SL to ground, which connects the first terminals of the memory cells 40 and 42 to ground. The signal RCL is then connected to a source of high voltage such as +12 volts. This attracts the electrons on the floating gates 44 and 46 and causes them to tunnel through the insulating layer to the control gates 52 and 54, to be removed from the floating gates 44 and 46. The removal of the electrons from the floating gates 44 and 46 continues until the transistors 48 and 50 become conductive. This can be done by erasing the floating gates 44 and 46 so that the floating gates become positively charged.

Thereafter, one of the memory cells 40 or 42 is programmed. This can be accomplished by connecting the SL signal to +10 volts. WL is then connected to +1.8 volts. If memory cell 40 is to be programmed, then BL is connected to ground (or slightly above ground, such as 0.6 v) with $\overline{BL}$ connected to Vcc. Since the voltage on $\overline{BL}$ is higher than the voltage on WL, no electrons would flow in the channel between $\overline{BL}$ and SL. However, since BL is at ground (or 0.6 v), its electrons would flow from BL to SL and would be hot channel injected onto the floating gate 44, all as described in U.S. Pat. Nos. 5,029,130 and 5,572,054.

Once one of the memory cells 40 or 42 is programmed, then the state of the memory cells 40 and 42 can be written into the SRAM 20. This can be accomplished by connecting EERCL to Vcc volts thereby turning on the pass transistors 34 and 36 respectively. SL is then connected to 0.0 volts. If the memory cell 40 is programmed, then electrons on the floating gate 44 cause transistor 48 to block the signal from SL to pass through transistor 34 to the first node 30. However, for the memory cell 42, since the floating gate is erased, transistor 50 would conduct and therefore the voltage from SL is passed through the transistor 50 and through the pass transistor 36 to second node 32. Thus, the second node 32 is pulled down and the first node 30 is pulled up to Vcc, thereby programming the SRAM 20.

There are many drawbacks of the circuit 10. In particular, the circuit 10 does not permit the contents of the SRAM 20 to be written first and then written into the non-volatile memory cell. This leaves the disadvantage that programming has to occur always first into and from the non-volatile memory cells, which is time consuming.

SUMMARY OF THE INVENTION

Accordingly, in the present invention, a non-volatile flip-flop cell comprises a volatile flip-flop having a bit signal and an inverse bit signal. A first and second non-volatile cells are also provided with each cell having a first terminal and a second terminal with a channel therebetween. A floating gate is over a first portion of a channel and is over a portion of the second terminal and a control gate is over a second portion of the channel. A first switch supplies the bit signal to the first terminal of the first cell and the inverse bit signal to the first terminal of the second cell. A second switch supplies the bit signal to the first terminal of the second cell and the inverse bit signal to the first terminal of the first cell. A first means supplies a first voltage to the second terminal of the first and second cells and a second means supplies a second voltage to the control gate of the first and second cells.

DETAILED DESCRIPTION OF THE DRAWINGS

Figure 1:
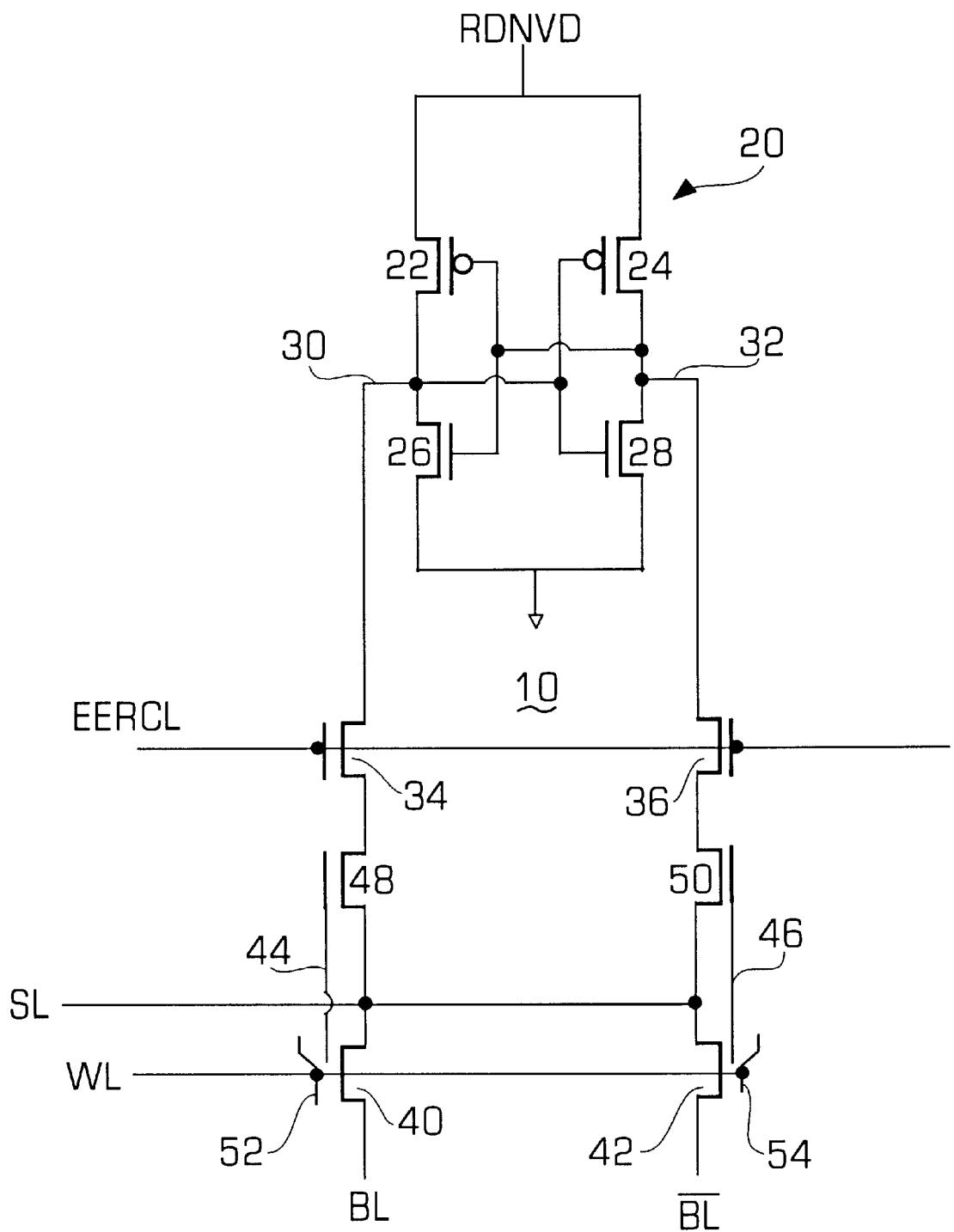
FIG. 1 is a circuit diagram of a non-volatile flip-flop circuit of the prior art.
Figure 2:
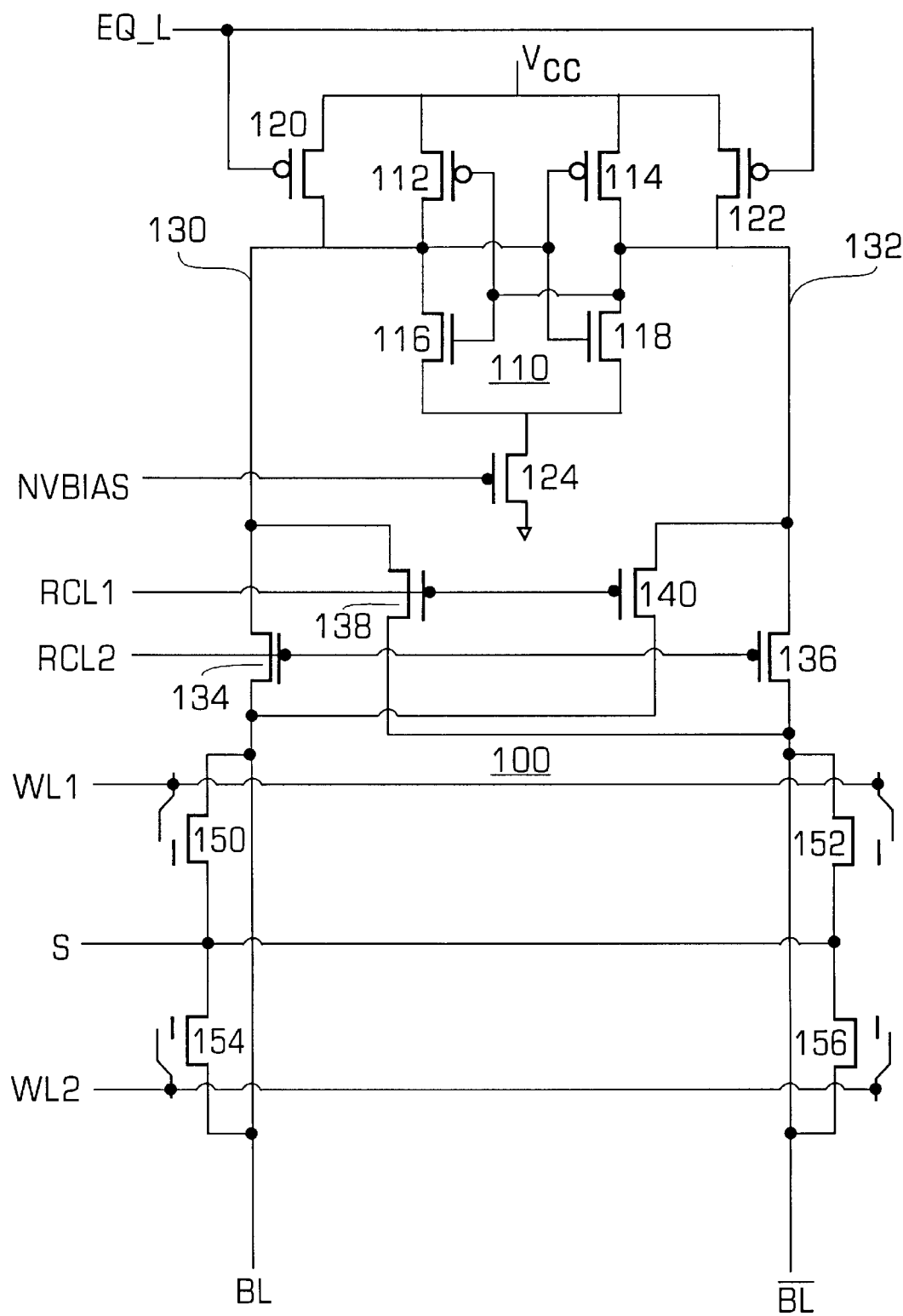
FIG. 2 is a circuit diagram of a non-volatile flip-flop circuit of the present invention.

Referring to FIG. 2 there is shown a schematic circuit diagram of a non-volatile flip-flop circuit 100 of the present invention. The circuit 100 comprise an SRAM latch 110. The SRAM latch 110 is similar to the SRAM 20 shown in FIG. 1. The SRAM latch 110 comprises a pair of cross-coupled PMOS transistors 112 and 114, and a pair of cross-coupled NMOS transistors 116 and 118. The sources of the PMOS transistors 112 and 114 are connected together and to a voltage source Vcc. The source of the NMOS transistors 116 and 118 are connected together and are connected to ground through a pass transistor 124 whose gate is connected to the signal NVBIAS. The latch 110 also has a first node 130 and a second node 132 which provides inputs and outputs to and from the latch 110. Finally, the latch 110 comprises a second pair of PMOS transistors 120 and 122 connected in parallel with the first pair of PMOS transistors 112 and 114 between Vcc and the first node 130 and the second node 132 respectively. The gates of the second pair of PMOS transistors 120 and 122 are activated by the signal EQ_L.

The circuit 100 receives and outputs BL and $\overline{BL}$ signals similar to that shown in FIG. 1. The signals BL and $\overline{BL}$ are passed through a first pair of switch transistors 134 and 136 respectively and are connected to the first and second nodes 130 and 132 respectively. The first pair of switch transistors 134 and 136 are activated by the signal RCL2. In addition, a second pair of switching transistors 138 and 140, whose gate is connected to receive the signal RCL1, connects BL to the second node 132 and $\overline{BL}$ to the first node 130.

Finally, the circuit 100 comprises 4 non-volatile memory cells 150, 152, 154, and 156. However, as will be shown, only one pair of memory cells, either 150 and 152 or 154 and 156 is necessary for the operation of the circuit 100. Each of the memory cells 150, 152, 154, and 156 is of a split gate floating gate type memory cell and is the same as that described in FIG. 1 and is disclosed in U.S. Pat. Nos. 5,029,130 and 5,572,054, whose disclosures are incorporated herein in their entirety.

Each of the memory cells 150, 152, 154, and 156 comprises a first and a second terminal with a channel therebetween. A floating gate is insulated from the channel and is over a first portion of the channel and over a portion of the second terminal. A control gate is over a second portion of the channel and insulated therefrom. The first terminal of memory cells 150 and 152 are connected to BL and $\overline{BL}$ respectively. The control gates of memory cells 150 and 152 are connected to receive the signal WL1. The second terminal of memory cells 150 and 152 are connected together to receive the signal S. The second pair of memory cells 154 and 156 are connected in like fashion. The first terminals of memory cells 154 and 156 are connected to BL and $\overline{BL}$ respectively. The control gates of memory cells 154 and 156 are connected together and receive the signal WL2. The second terminals of the memory cells 154 and 156 are connected together and receive the signal S. Finally, of course, the BL and $\overline{BL}$ signals connect the first terminals of memory cells 154 and 150 and memory cell 156 and 152 respectively.

Operation
Read and Write Into SRAM 110

For this operation, the signals WL1, WL2, S and RCL1 are kept at ground. In addition, NVBIAS is set at Vcc connecting the source of the NMOS transistors 116 and 118 to ground. Finally, RCL2 is raised to Vcc volts permitting the signal on BL and $\overline{BL}$ to pass through the pass transistors 134 and 136 respectively to the first and second nodes 130 and 132 respectively. Since BL is the inverse signal of $\overline{BL}$ (and vice versa), this causes the latch 110 to store the state of BL/$\overline{BL}$. Similarly, for read out of the signals stored in the latch 110, RCL2 is raised to Vcc which permits transistors 136 and 134 to be activated so that the signals on the second and first nodes 132 and 130 can be read out at $\overline{BL}$ and BL respectively.

Writing to Non-Volatile Memory Cells from SRAM

In this operation, RCL1 and RCL2 are initially both kept at ground thereby isolating the SRAM circuit 110 portion of the circuit 100 from the non-volatile memory cells 150, 152, 154, and 156. All the non-volatile memory cells 150, 152, 154, and 156 are erased before some are programmed by the contents of the latch 110. As disclosed in U.S. Pat. No. 5,029,130, this occurs by raising the voltage of the control gate to a high potential, such as +12 volts and maintaining the voltage on the second terminal at ground. Thus, S is connected to ground, and WL1 is connected to +12 volts. This would then cause the erasure of the non-volatile memory cells 150 and 152 by causing electrons from the floating gate to Fowler-Nordheim tunnel to the control gate WL1. Similarly, a voltage of +12 volts is applied to WL2 connecting the control gates of non-volatile memory cells 154 and 156 thereby erasing the memory cells 154 and 156.

To program either memory cells 150 and 154 or 152 and 156, based upon the contents of the SRAM latch 110, assume that first node 130 is at 0 volts and second node 132 is at Vcc volts. NVBIAS is set to nearly 1 volt to limit the current through transistor 124 to about 5 uamp. RCL2 is then brought to Vcc causing switching transistors 134 and 136 to turn on. The voltage at first node 130 and second node 132 respectively are then supplied to the first terminals of the non-volatile memory cells 150 and 154 and 152 and 156 respectively. WL1 is raised to approximately +1.8 volts. S is connected to +10 volts. For the memory cell 150, this causes electrons from ground to pass through transistor 124, through switching transistor 134, to pass in the channel between the first and second terminals of the memory cell 150, and then to be hot electron injected onto the floating gate, to program the memory cell 150. However, for the memory cell 152, because the voltage at the first terminal (node 132) is higher than the voltage at WL1, the electrons do not pass in the channel to the second terminal. Thus, no electrons are injected onto the floating gate and the memory cell 152 remains erased.

Transfer of Contents From Non-Volatile Memory Cells to SRAM Latch

In this mode of operation, the contents of the memory cells 150 and 152 are stored into the SRAM latch 110. As can be seen from the foregoing, a non-volatile memory cells in the programmed state should be transferred to the latch as a 0 volt and a non-volatile memory cell in the erased state should be transferred into a latch as the inverse thereof. Thus, assuming that memory cell 150 is programmed, then memory cells 152 remains in the erased state. S is grounded. WL1 is supplied as Vcc. RCL2 is maintained at ground thereby shutting off switching transistors 134 and 136. Before RCL1 is set at Vcc volts, which turns on switching transistors 138 and 140, EQ_L goes to low momentarily to equalize the nodes 130 and 132 of latch 110, to Vcc. If memory cell 152 is erased, then memory cell 152 will conduct and node 130 will be pulled down to ground to S, through switching transistor 138. As for node 132, it will be left at Vcc due to the memory cell 150 being programmed. During this transfer, NVBIAS can be slightly on or fully turned on.

As can be seen from the foregoing, with the combination circuit 100 of the present invention, the SRAM latch 110 can be used independently of the non-volatile memory cells for read and write thereby permitting rapid reading and writing of the memory as if the circuit 100 were simply an SRAM circuit. During the time period in which the SRAM circuit 110 portion of the combination circuit 100 is not being accessed, then the contents of the SRAM latch 110 can then be stored in the non-volatile memory cells 150, 152, 154, and 156. Finally, during initial boot up, the SRAM latch 110 can be restored to the status of the data that is stored on the non-volatile memory cells 150, 152, 154, and 156.

What is claimed is:

1. A non-volatile flip-flop circuit comprising:

a volatile flip-flop having a bit signal and an inverse bit signal;

a first and a second non-volatile cell, each having a first terminal and a second terminal with a channel therebetween, a floating gate over a first portion of said channel, and a portion of said second terminal and a control gate over a second portion of said channel;

a first switch for supplying said bit signal to said first terminal of said first cell and said inverse bit signal to said first terminal of said second cell;

a second switch for supplying said bit signal to said first terminal of said second cell and said inverse bit signal to said first terminal of said first cell;

first means for supplying a first voltage to said second terminal of said first and second cells; and second means for supplying a second voltage to said control gate of said first and second cells.

2. The circuit of claim 1 wherein said first switch comprises:

a first MOS transistor having a first terminal, a second terminal with a channel therebetween, and a gate for controlling the flow of current therebetween;

a second first MOS transistor having a first terminal, a second terminal with a channel therebetween, and a gate for controlling the flow of current therebetween;

said first terminal of said first MOS transistor for receiving said bit signal, said second terminal of said first MOS transistor connected to said first terminal of said first cell;

said first terminal of said second MOS transistor for receiving said inverse bit signal, said second terminal of said second MOS transistor connected to said first terminal of said second cell; and said gate of said first and second MOS transistors connected together for receiving a first switching signal.

3. The circuit of claim 2 wherein said first switching signal activates said first switch for storing status of said flip-flop in said first and second cells.

4. The circuit of claim 2 wherein said second switch comprises:

a third MOS transistor having a first terminal, a second terminal with a channel therebetween, and a gate for controlling the flow of current therebetween;

a four MOS transistor having a first terminal, a second term with a channel therebetween, and a gate for controlling the flow of current therebetween;

said first terminal of said third MOS transistor for receiving said bit signal, said second terminal of said third MOS transistor connected to said first terminal of said second cell;

said first terminal of said fourth MOS transistor for receiving said inverse bit signal, said second terminal of said fourth MOS transistor connected to said first terminal of said first cell; and said gate of said third and fourth MOS transistor connected together for receiving a second switching signal.

5. The circuit of claim 4 wherein said second switching signal activates said second switch for storing status of said first and second cells in said flip-flop.

6. The circuit of claim 1 wherein each of said first and second cells further comprising:

a first insulating layer between said floating gate and said channel, permitting hot election injection of electrons from said first terminal as they traverse to said second terminal.

7. The circuit of claim 6 wherein each of said first and second cells further comprising:

a second insulating layer between said floating gate and said control gate permitting Fowler-Nordheim tunneling of electrons from said floating gate to said control gate.

* * * * *